United States Patent
Wu et al.

(10) Patent No.: US 11,196,410 B2
(45) Date of Patent: *Dec. 7, 2021

(54) METHOD OF GENERATING PRECISE AND PVT-STABLE TIME DELAY OR FREQUENCY USING CMOS CIRCUITS

(71) Applicant: QUALCOMM Incorporated, San Diego, CA (US)

(72) Inventors: Zhengzheng Wu, Santa Cruz, CA (US); Xu Zhang, San Diego, CA (US); Xuhao Huang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/022,608

(22) Filed: Sep. 16, 2020

(65) Prior Publication Data

US 2021/0194474 A1 Jun. 24, 2021

Related U.S. Application Data

(63) Continuation of application No. 16/722,572, filed on Dec. 20, 2019, now Pat. No. 10,812,056.

(51) Int. Cl.
*H03K 5/134* (2014.01)
*H03K 3/03* (2006.01)
*H03K 5/00* (2006.01)

(52) U.S. Cl.
CPC ........... *H03K 5/134* (2014.07); *H03K 3/0315* (2013.01); *H03K 2005/00195* (2013.01)

(58) Field of Classification Search
CPC ....................................................... H03K 5/134
(Continued)

(56) References Cited

U.S. PATENT DOCUMENTS 6,043,718 A 3/2000 Diniz et al.
7,498,885 B2* 3/2009 Huang ................. H03K 3/0315
331/16

(Continued)

FOREIGN PATENT DOCUMENTS

EP 1791256 A1 5/2007

OTHER PUBLICATIONS

Levanting S., et al., "An Adaptive Pre-Distortion Technique to Mitigate the DTC Nonlinearity in Digital PLLs", IEEE Journal of Solid-State Circuits, vol. 49, No. 8, Aug. 2014, pp. 1762-1772.

(Continued)

*Primary Examiner* — Joseph Chang
(74) *Attorney, Agent, or Firm* — Chui-kiu Teresa Wong

(57) ABSTRACT

A method of generating precise and PVT-stable time delay or frequency using CMOS circuits is disclosed. In some implementations, the method includes providing a reference voltage using a resistive module at a positive input terminal of an operational amplifier, coupling gates of a pair of p-type metal oxide semiconductor (pMOS) transistors and a compensation capacitor to an output terminal of the operational amplifier to generate a first bias signal, and coupling a pair of n-type metal oxide semiconductor (nMOS) transistors to a negative terminal of the operational amplifier to generate a second bias signal at the negative terminal, wherein the pair of nMOS transistors is substantially the same as a pair of nMOS transistors in the CMOS delay circuit.

26 Claims, 9 Drawing Sheets

(58) Field of Classification Search
USPC .......................................... 331/57, 185, 186
See application file for complete search history.

(56) References Cited

U.S. PATENT DOCUMENTS

| | | | |
|---|---|---|---|
| 7,777,581 B2 | 8/2010 | Pfaff et al. | |
| 7,834,709 B2 * | 11/2010 | Saurabh | H03L 7/0995 331/57 |
| 7,948,330 B2 * | 5/2011 | Seo | H03K 3/0322 331/186 |
| 8,604,884 B2 | 12/2013 | Coban et al. | |
| 8,810,324 B2 * | 8/2014 | Hung | H03B 5/24 331/57 |
| 8,970,311 B2 * | 3/2015 | Ardehali | H03L 7/0995 331/57 |
| 10,812,056 B1 * | 10/2020 | Wu | H03K 3/0315 |
| 2013/0113574 A1 | 5/2013 | Hung et al. | |

OTHER PUBLICATIONS

Maneatis J.G., et al., "Self-Biased High-Bandwidth Low-Jitter 1-to-4096 Multiplier Clock Generator PLL", IEEE Journal of Solid-State Circuits, vol. 38, No. 11, Nov. 2003, pp. 1795-1803.

Wu Y., et al., "A 3.5-6.8-GHz Wide-Bandwidth DTC-Assisted Fractional-N All-Digital PLL With a MASH $\Delta\Sigma$-TDC for Low In-Band Phase Noise", IEEE Journal of Solid-State Circuits, vol. 52, No. 7, Jul. 2017, pp. 1885-1903.

International Search Report and Written Opinion—PCT/US2020/057693—ISA/EPO—dated Feb. 5, 2021.

* cited by examiner

METHOD OF GENERATING PRECISE AND PVT-STABLE TIME DELAY OR FREQUENCY USING CMOS CIRCUITS

CLAIM OF PRIORITY

This application is a continuation of U.S. patent application Ser. No. 16/722,572 entitled "METHOD OF GENERATING PRECISE AND PVT-STABLE TIME DELAY OR FREQUENCY USING CMOS CIRCUITS" filed Dec. 20, 2019, and assigned to the assignee hereof and hereby expressly incorporated by reference herein.

FIELD OF DISCLOSURE

Aspects of the present disclosure relate generally to biasing of delay circuits, and more particularly to an apparatus and a method for generating precise and process-voltage-temperature (PVT)-stable time delay or frequency using complementary metal oxide semiconductor (CMOS) circuits.

BACKGROUND

A delay circuit is a circuit configured to delay a signal by a time delay. Delay circuits may be used to adjust the timing of a signal by delaying the signal by a certain time delay. For example, multiple delay circuits may be used to build a delay line to adjust the timing of a signal (e.g., a data signal or a clock signal). Delay circuits are widely used in phase locked loops (PLLs), delay locked loops (DLLs), time-based analog to digital converters (ADCs), radio frequency (RF) phase shifters, etc. However, the time delay of the delay circuit is susceptible to process, voltage, and temperature (PVT) variations.

SUMMARY OF THE DISCLOSURE

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

In some implementations, an apparatus has at least one complementary metal oxide semiconductor (CMOS) delay circuit configured to receive a pair of differential input signals and to generate a pair of differential output signals after a delay in time, and a bias generator configured to provide a first bias signal and a second bias signal to the at least one CMOS delay circuit. The bias generator can include an operational amplifier having an output, a positive input terminal, and a negative input terminal; a resistive module coupled between the positive input terminal and ground; and a pair of n-type metal oxide semiconductor (nMOS) transistors coupled between the negative input terminal and the ground, wherein the output of the operational amplifier is configured to provide the first bias signal, and the negative input terminal of the operational amplifier is configured to provide the second bias signal.

According to some aspects of the disclosure, the CMOS delay circuit and the bias generator can be part of a ring oscillator. The ring oscillator can further include additional delay circuits such that the delay circuits are coupled to each other to form a ring.

In some implementations, the at least one CMOS delay circuit comprises a first branch having a first input transistor and a first pair of nMOS transistors, the first pair of nMOS transistors coupled to each other in parallel between a drain of the first input transistor and the ground. Furthermore, the at least one CMOS delay circuit further comprises a second branch having a second input transistor and a second pair of nMOS transistors, the second pair of nMOS transistors coupled to each other in parallel between a drain of the second input transistor and the ground, and wherein the pair of nMOS transistors of the bias generator, the first pair of nMOS transistors, and the second pair of nMOS transistors are substantially the same.

In some implementations, the at least one CMOS delay circuit further comprises a bias transistor having a gate, a source, and a drain, the gate is configured to receive the first bias signal from the bias generator and the source is configured to receive a voltage supply. Furthermore, the bias transistor is a p-type metal oxide semiconductor (pMOS) transistor.

In some implementations, the at least one CMOS delay circuit further includes a first startup switch having a source, a drain, and a gate, the source of the first startup switch coupled to the drain of the bias transistor and the drain of the first startup switch coupled to a source of the first input transistor; a second startup switch having a source, a drain, and a gate, the source of the second startup switch coupled to the drain of the bias transistor; and an auxiliary branch having a first pMOS transistor and a second pMOS transistor, wherein the first pMOS transistor is coupled between the drain of the second startup switch and the drain of the first input transistor, the second pMOS transistor is coupled between the drain of the second startup switch and the drain of the second input transistor.

In some implementations, a gate of the first pMOS transistor of the auxiliary branch is configured to receive a low voltage supply and a gate of the second pMOS transistor of the auxiliary branch is configured to receive the second bias signal from the bias generator.

In some implementations, a gate of a first nMOS transistor of the first pair of nMOS transistors and a gate of a second nMOS transistor of the second pair of nMOS transistors are coupled together and configured to receive the second bias signal from the bias generator.

In some implementations, the delay is proportional to an equivalent resistance Rref of the resistive module.

Alternatively, the resistive module comprises a switched capacitor resistor having a switch, a first capacitor having a capacitance of $C_{SW}$, and a second capacitor having a capacitance of $C_H$ coupled to each other in parallel. The at least one CMOS delay circuit further includes a first load capacitor coupled between a first output node and the ground, and a second load capacitor coupled between a second output node and the ground, wherein the first load capacitor and the second load capacitor have substantially the same capacitance $C_L$ and the delay is proportional to a ratio of $C_L$ to $C_{SW}$.

In some implementations, the at least one CMOS delay circuit further comprises a capacitor array for fine tuning of the delay, the capacitor array is configured to receive a plurality of control bits from a plurality of buffers biased by the second bias signal from the bias generator.

In some implementations, the resistive module comprises a variable resistor.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

As mentioned above, delay circuits are widely used to adjust the timing of a signal by delaying the signal by a certain time delay. For example, complementary metal oxide semiconductor (CMOS) delay circuits are often used in time-based circuits, such as PLLs, DLLs, etc. However, the time delay of CMOS delay circuits can be quite sensitive to PVT variations. Conventional voltage or current regulation techniques used in oscillators (e.g., digitally controlled oscillators (DCO's), voltage controlled oscillators (VCO's)) cannot be applied to programmable delay lines, digital RF phase shifters, time-based ADC's, etc., due to the long startup/settling time. Furthermore, these conventional voltage or current regulation techniques require closed-loop correction for PVT drift. The issue of PVT sensitivity can be better illustrated using the conventional bias circuit and delay circuit shown in FIGS. 1A and 1B.

Figures 1A, 1B:
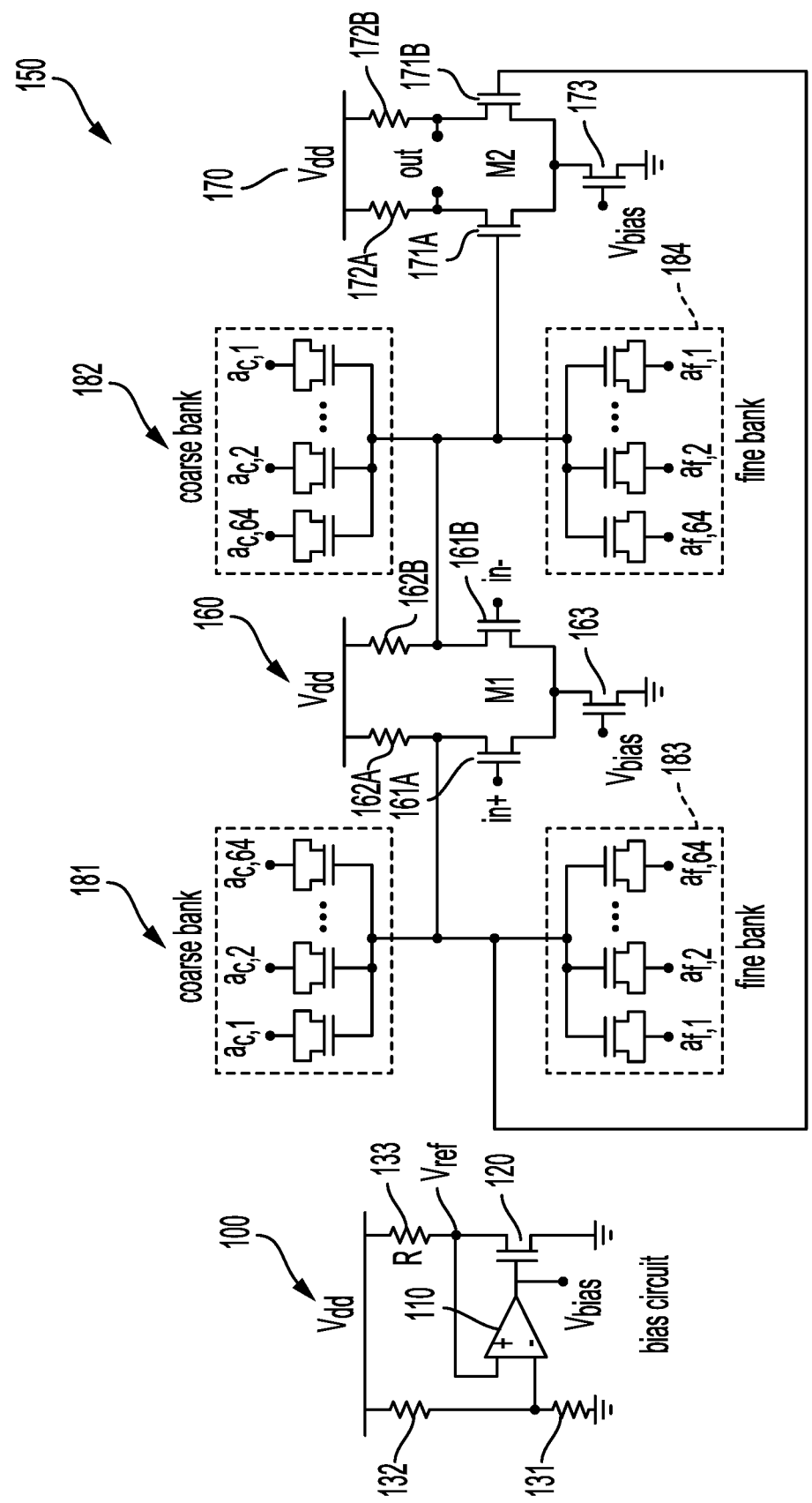
FIGS. 1A and 1C show some conventional bias circuits for a delay circuit.
FIG. 1B is a conventional delay circuit.

FIG. 1A shows a conventional bias circuit 100 configured to provide a bias voltage Vbias to a delay circuit. The bias circuit 100 includes an operational amplifier 110, an n-type metal oxide semiconductor (nMOS) transistor 120, and three resistors 131, 132, and 133. Resistors 131, 132, and 133 are all of the same resistance R. Resistor 131 is coupled between a negative input terminal of operational amplifier 110 and ground. Resistor 132 is coupled between the negative input terminal of operational amplifier 110 and a voltage supply Vdd. Resistor 133 is coupled between a positive input terminal of operational amplifier 110 and the voltage supply Vdd. The nMOS transistor 120 has a gate, a source, and a drain. The gate is coupled to an output of the operational amplifier 110, the source is coupled to ground, and the drain is coupled to resistor 133 and the input terminal of operational amplifier 110.

During operation, the operational amplifier 110 forces the voltages at both the positive and negative input terminal of operational amplifier 110 to be substantially the same at $V_{ref}$. A bias current flowing through resistor 133 can be determined by:

$$I_R = (Vdd - Vref)/R \qquad \text{[Equation 1]}$$

Because the operational amplifier 110 does not allow current flowing into its input terminals, the bias current $I_R$ flowing through resistor 133 will flow through the nMOS transistor 120. A bias voltage $V_{bias}$ is provided at the gate of the nMOS transistor 120 such that other transistors biased by $V_{bias}$ will mirror (or generate) a bias current substantially the same as $I_R$. However, as shown by Equation 1 above, any variation in the supply voltage Vdd can cause $I_R$ to vary as well. The bias voltage $V_{bias}$ can be used to bias a conventional delay circuit shown in FIG. 1B.

FIG. 1B illustrates a conventional delay circuit 150 that can be biased by the bias voltage Vbias from the bias circuit 100 in FIG. 1A. The delay circuit 150 includes two delay stages 160 and 170, two coarse banks of metal oxide (MOS) capacitors 181 and 182, and two fine banks of metal oxide (MOS) capacitors 183 and 184.

The two delay stages 160 and 170 are substantially the same. Delay stage 160 includes a pair of input transistors 161A and 161B, a bias transistor 163, and two load resistors 162A and 162B. Likewise, delay stage 170 includes a pair of input transistors 171A and 171B, a bias transistor 173, and two load resistors 172A and 172B. The input transistors 161A and 161B receive a pair of input differential signals at their gates, and output a pair of output differential signals at their drains, which are coupled to the gates of the input transistors 171B and 171A, respectively. Both coarse banks of capacitors 181 and 182, as well as both fine banks of capacitors 183 and 184, are coupled to the drains of the input transistors 161A and 161B. The capacitor banks 181-184 are digital controlled to vary the delay through the delay stages 160 and 170. In a typical design, the fine delay range is intentionally configured to be much larger than the coarse delay resolution (such as by a factor of 2x) to cover process variations. However, the delay of the delay stages 160 and 170 may also vary due to variations in the bias voltage $V_{bias}$ as discussed below.

Figure 1C:
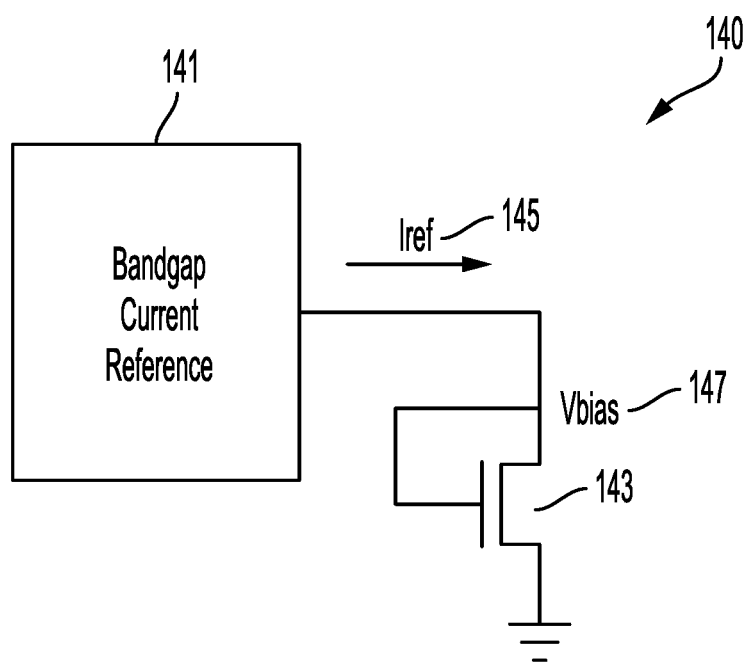

As shown in FIG. 1B, each of the delay stages 160 and 170 includes a bias transistor 163 and 173, respectively. Each of the bias transistors 163 and 173 is coupled between ground and the pair of input nMOS transistors 161A and 161B, or 171A and 171B, respectively. Both bias transistors 163 and 173 are driven at their gates by $V_{bias}$ from the bias circuit 100 to each generate a bias current substantially similar to $I_R$. Note that $I_R$ can vary with the supply voltage Vdd as demonstrated by Equation 1 above. The change/variation in $I_R$ can in turn lead to changes in the delay of the delay stages 160 and 170. In sum, the delay provided by the delay circuit 150 biased by the bias circuit 100 is not voltage stable. In an alternative conventional design shown in FIG. 1C, a bandgap current reference 141 generates a reference current $I_{ref}$ 145, which is used to define a bias voltage $V_{bias}$ 147. Specifically, an output of the bandgap current reference 141 is connected to a drain and a gate of an nMOS transistor 143. A source of the nMOS transistor 143 is connected to ground. Although the reference current Iref 145 from the bandgap current reference 141 is more stable, the delay of the delay stages 160 and 170 may still vary due to drifts of the transistors' properties in the delay circuit 150 and changes in voltage swing in the delay circuit 150. The bandgap current reference 141 does not track or compensate for the drifts of transistor properties or change in voltage swing in the delay circuit 150. Therefore, there is a need in the art to provide a delay circuit with a biasing scheme that is process, voltage, and temperature (PVT) stable (or insensitive).

In the current disclosure, various implementations of a novel bias generator that provides PVT-stable (or PVT-insensitive) bias signals to one or more delay circuits in order to generate a PVT-stable time delay (or frequency) using CMOS circuits are described. In some implementations of a CMOS delay circuit biasing scheme, a bias generator provides a first and a second bias signals to the CMOS delay circuit using an operational amplifier and a resistive module. For example, the resistive module can be implemented using an on-chip switched capacitor resistor having a switch capacitance of $C_{SW}$. The CMOS delay circuit is configured to receive a pair of differential input signals and to output a pair of differential output signals after a delay in time. The CMOS delay circuit further includes a load capacitance $C_L$. The delay in time can be configured to be proportional to a ratio of $C_{SW}$ to $C_L$. Further, the delay in time is independent of the supply voltage to the bias generator and/or the CMOS delay circuit. Because the ratio of $C_L$ to $C_{SW}$ can generally be more accurately controlled relative to the capacitance (or impedance) of an individual component in semiconductor circuits, the CMOS delay circuit biasing scheme can provide a more PVT-stable time delay than conventional approaches. More details of the CMOS delay circuit biasing scheme are discussed below.

Figure 2:
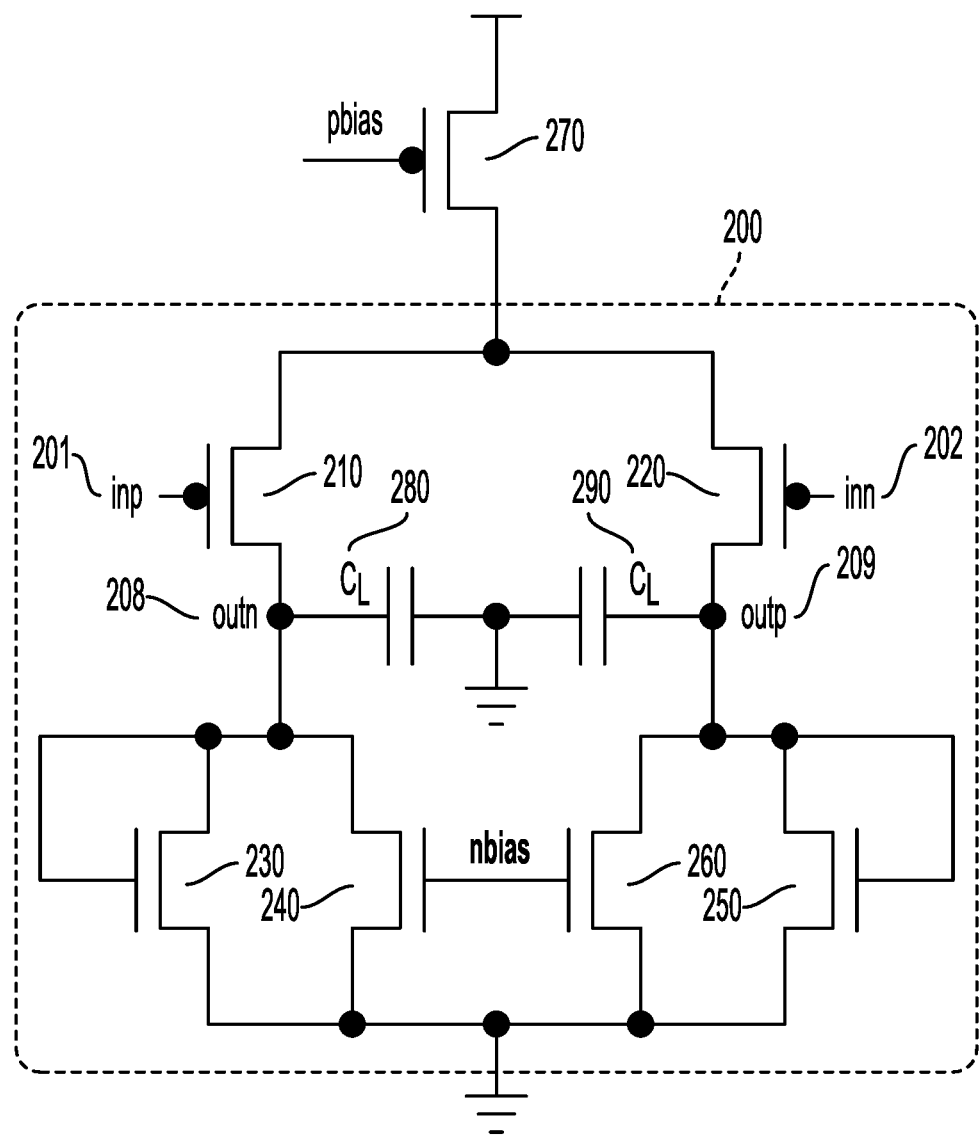
FIG. 2 shows one implementation of a CMOS delay circuit.

FIG. 2 shows one implementation of a CMOS delay circuit 200. The CMOS delay circuit 200 is coupled to a voltage source $V_{DD}$ via a bias transistor 270. In some implementations, the bias transistor 270 is a pMOS transistor. A source of bias transistor 270 is coupled to a voltage source $V_{DD}$, a drain of bias transistor 270 is coupled to the CMOS delay circuit 200, and a gate of bias transistor 270 is configured to be driven by a bias voltage pbias. The bias voltage pbias can be provided by a bias generator, such as the bias generator 300 shown in FIG. 3. More details of the bias generator 300 will be described below. On the bias voltage at pbias can be defined by the same node in the bias generator 300, allowing a bias current (bias) to flow from the voltage source $V_{DD}$ through the bias transistor 270 to the CMOS delay circuit 200.

In some implementations, the delay circuit 200 includes two input transistors 210 and 220, two pairs of transistors 230 and 240, and 250 and 260, and two load capacitors 280 and 290. The two pairs of transistors 230 and 240, and 250 and 260 may also be referred to as active load transistors. The load capacitors 280 and 290 can have substantially the same capacitance of $C_L$. A node between the load capacitors 280 and 290 is coupled to ground or a bias node having an alternate current (AC) virtual ground. The load capacitors 280 and 290 can be implemented using simple capacitors having fixed capacitances, such as metal-oxide-metal (MOM) capacitors, metal oxide semiconductor (MOS) capacitors, or a combination of both.

In some implementations, the input transistors 210 and 220 are pMOS transistors. The sources of both input transistors 210 and 220 are coupled to the drain of the bias transistor 270. The gate of the input transistor 210 is configured to receive an input signal inp and the gate of the input transistor 220 is configured to receive an input signal inn. The input signals inp and inn are a pair of differential input signals of complementary values. For example, when inp is at logic high, inn is at logic low; and vice versa. The drain of input transistor 210 is coupled to load capacitor 280 at an output node outn on the left side of the CMOS delay circuit 200. Likewise, the drain of input transistor 220 is coupled to load capacitor 290 at an output node outp on the right side of the CMOS delay circuit 200.

As shown in FIG. 2, the output node outn is further coupled to the drains of the pair of active load transistors 230 and 240. The pair of transistors 230 and 240 are further coupled to each other at their sources, which is coupled to ground. The gate of the transistor 230 is connected to the drain of the transistor 230, whereas the gate of the transistor 240 is connected to the gate of the transistor 260 on the right side of the CMOS delay circuit 200. The output node outp is further coupled to the drains of the pair of active load transistors 250 and 260. The pair of transistors 250 and 260 are further coupled to each other at their sources, which is coupled to ground. The gate of the transistor 250 is connected to the drain of the transistor 250, whereas the gate of the transistor 260 is connected to the gate of the transistor 240 on the left side of the CMOS delay circuit 200.

In some implementations, the active load transistors 230, 240, 250, and 260 are nMOS transistors. The gates of both transistors 240 and 260 are configured to be driven by a bias voltage nbias. Like the bias voltage pbias, the bias voltage pbias can be provided by the bias generator, such as the bias generator 300 shown in FIG. 3. More details of the bias generator 300 will be described below.

During operation, a pair of differential input signals, inp and inn, can be applied to the gates of the input transistors 210 and 220, respectively. For the purpose of illustration, suppose inp is at a high voltage and inn is at a low voltage. Because inp is at a high voltage, the input transistor 210 is turned off. On the contrary, because inn is at a low voltage, the input transistor 220 is turned on. As a result, the bias current flowing through the bias transistor 270 substantially entirely flows through the input transistor 220 and there is no current flowing through the input transistor 210. Because there is no current flowing through the input transistor 210, the voltage at the drain of the input transistor 210, outn, becomes 0. As the current flowing through the input transistor 220 flows into the branch formed by transistors 250 and 260, and then to ground, a high voltage at the output node outp is generated. Because the gate of the transistor 260 is driven by the bias voltage nbias, the voltage swing on the output node outp is approximately between 0 and the bias voltage nbias ($V_{nbias}$). The load capacitor 290 will be charged or discharged to delay the high-to-low or low-to-high transitions at the output node outp.

The CMOS delay circuit 200 operates in a complementary fashion when inp is at a low voltage and inn is at a high voltage. Because inp is at a low voltage, the input transistor 210 is turned on. On the contrary, because inn is at a low voltage, the input transistor 220 is turned off. As a result, the bias current flowing through the bias transistor 270 substantially entirely flows through the input transistor 210 and there is no current flowing through the input transistor 220. Because there is no current flowing through the input transistor 220, the voltage at the drain of the input transistor 220, outp, becomes zero. As the current flowing through the input transistor 210 flows into the branch formed by transistors 230 and 240, and then to ground, a high voltage at the output node outn is generated. Because the gate of the transistor 240 is driven by the bias voltage nbias, the voltage swing on the output node outn is approximately between 0 and the bias signal nbias (which is a bias voltage $V_{nbias}$ in this implementation). The load capacitor 280 will be charged or discharged to delay the low-to-high or high-to-low transitions at the output node outn.

As illustrated by the two examples described above, the CMOS delay circuit 200 functions as an inverter to invert the values of the input differential signals inp and inn to generate the pair of differential output signals outp and outn. After the pair of differential input signals inp and inn have transitioned to new values, the pair of differential output signals outp and outn will follow after a certain delay of time approximately proportional to $V_{thias}$. Specifically, the delay of time ($\Delta T$) can be determined by:

$$\Delta T = C_L \cdot \Delta V / I \quad \text{[Equation 2]}$$

Note that $\Delta V/I \approx V_{nbias}/(K \cdot I_{bias})$, where K is the current mirror ratio, therefore, the delay of time ($\Delta T$) can be approximated as:

$$\Delta T \approx C_L \cdot V_{nbias}/(K \cdot I_{bias}) \quad \text{[Equation 3]}$$

To reduce the impact of process, voltage, and temperature (PVT) on the CMOS delay circuit 200, the bias signals nbias and pbias have to be PVT-stable. Some implementations of a bias generator capable of generating PVT-stable bias signals pbias and nbias is shown in FIG. 3.

Figure 3:
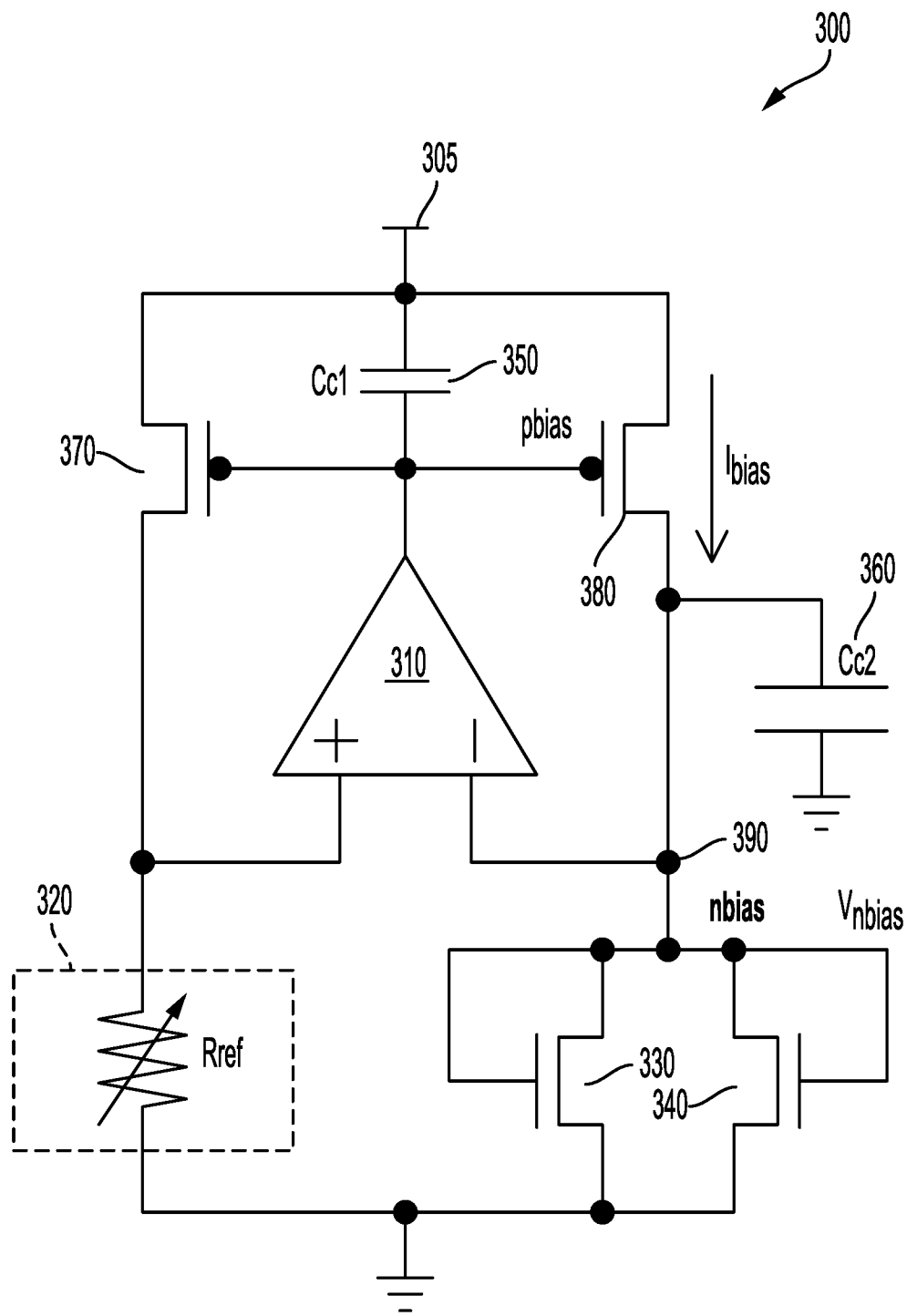
FIG. 3 shows one implementation of a bias generator for generating bias signals for one or more CMOS delay circuits.

FIG. 3 shows one implementation of a bias generator 300 for generating bias signals for one or more CMOS delay circuits, such as the CMOS delay circuit 200 in FIG. 2. In other words, the bias generator 300 can generate bias signals for a single delay circuit or multiple delay circuits. The bias generator 300 includes an operational amplifier ("op amp") 310, an on-chip resistive module 320, a pair of nMOS transistors 330 and 340, a first compensation capacitor Cc1 350, a second compensation capacitor Cc2 360, and a pair of pMOS transistors 370 and 380. It should be appreciated that other implementations of the bias generator 300 may include additional components not shown in FIG. 3, such as, for example, additional decoupling capacitors.

As shown in FIG. 3, the operational amplifier 310 has a positive input terminal, a negative input terminal, and an output terminal. The on-chip resistive module 320 is coupled between the positive terminal and ground. The negative input terminal of the operational amplifier 310 is coupled to nbias node 390. The pair of nMOS transistors 330 and 340 are coupled in parallel to each other between the nbias node 390 and ground. The first compensation capacitor Cc1 350 is coupled between the output terminal of the operational amplifier 310 and a voltage supply $V_{DD}$ 305. The gates of both pMOS transistors 370 and 380 are also coupled to the output terminal. The sources of both pMOS transistors 370 and 380 are coupled to the voltage supply $V_{DD}$ 305. The drain of the pMOS transistor 370 is coupled to both the positive terminal of the operational amplifier 310 and the on-chip resistive module 320. The drain of the pMOS transistor 380 is coupled to the nbias node 390. In addition, the second compensation capacitor Cc2 360 is coupled between the nbias node 390 and ground. The second compensation capacitor Cc2 360 can serve as both compensation capacitor and decoupling capacitor to reduce noise in the bias generator 300. The bias signal nbias (which is a bias voltage $V_{nbias}$ in this implementation) can be provided at the nbias node 390, whereas the bias signal pbias can be provided at the output terminal of the operational amplifier 310 (i.e., at the gates of both pMOS transistors 370 and 380). The associated bias current Ibms can be generated through the pMOS transistor 380, which is driven by the bias signal pbias at its gate. A similar bias current Ibms can be provided to a CMOS delay circuit (e.g., CMOS delay circuit 200) by applying the bias signal pbias to the gate of a bias transistor (e.g., bias transistor 270) that electrically couples the CMOS delay circuit to a voltage supply.

In some implementations, the on-chip resistive module 320 provides a reference voltage in the bias generator 300. The on-chip resistive module 320 is implemented using components residing on the same silicon substrate as other components of the bias generator 300 (e.g., the nMOS transistors 330 and 340, the pMOS transistors 370 and 380, the operational amplifier 310, and the compensation capacitors 350 and 360). Thus, the resistive module 320 is referred to as "on-chip." In some implementations, the on-chip resistive module 320 is made up of a simple resistor. In some implementations, the on-chip resistive module 320 is made up of a variable resistor. In common commercial foundry processes, the on-chip resistive module 320 is made temperature and voltage stable. As a result, the bias voltages generated by the bias generator 300 can be temperature and voltage stable as well.

Figure 4:
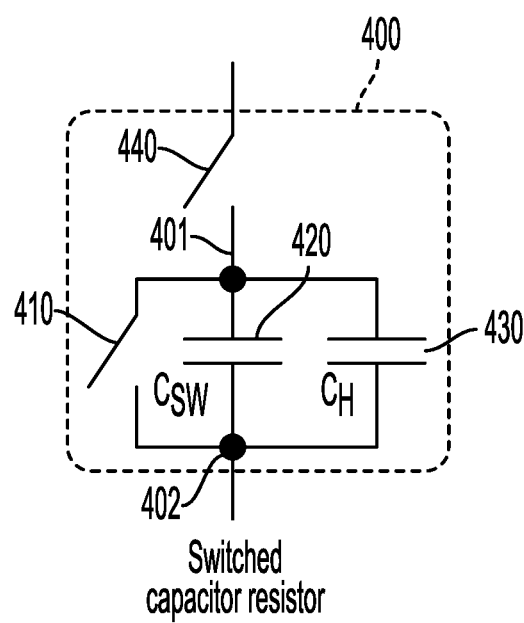
FIG. 4 shows one implementation of a switched capacitor resistor usable in the bias generator shown in FIG. 3.

In an alternative implementation, the on-chip resistive module 320 is made up of a switched capacitor resistor. Similar to the implementation discussed above, the switched capacitor resistor is made up of components residing on the same silicon substrate as other components of the bias generator 300. One example of a switched capacitor resistor 400 suitable for the bias generator 300 is shown in FIG. 4. Referring to FIG. 4, the switched capacitor resistor 400 includes a first switch 410, a first capacitor $C_{SW}$ 420, a second capacitor $C_H$ 430, and a second switch 440. The first switch 410, the first capacitor $C_{SW}$ 420, and the second capacitor $C_H$ 430 are coupled to each other in parallel between two nodes 401 and 402. The node 401 is further coupled to the second switch 440. The equivalent resistance Rref of the switched capacitor resistor 400 can be computed by:

$$Rref = 1/C_{SW} \cdot f_0, \quad \text{[Equation 4]}$$

where $f_0$ is a reference clock frequency. In some implementations, $f_0$ can be provided by a crystal clock (or crystal oscillator) that is part per million in frequency accuracy and stability over working environment. Alternatively, $f_0$ can be provided by frequency source (or clock source), such as a phase locked loop (PLL) or digital synthesizer, tunable to change the delay value.

Referring back to the bias generator 300 in FIG. 3, the on-chip resistive module 320 provides a reference voltage at the positive input terminal of the operational amplifier 310, forcing the voltage at the negative input terminal of the operational amplifier 310 (i.e., $V_{nbias}$) to be substantially the same as the reference voltage. The bias current $I_{bias}$ through the pMOS transistor 380 is also mirrored to the pMOS transistor 370. Thus, the voltage at the node nbias 390 can be expressed as:

$$V_{nbias} = Rref \cdot I_{bias},$$

that is, $$V_{nbias}/I_{bias} = Rref \quad \text{[Equation 5]}$$

By substituting Equation 5 into Equation 3 above, the delay of time ΔT of the delay circuit 200 can be referenced to Rref as:

$$\Delta T = (C_L * Rref)/K \quad \text{[Equation 6]}$$

Note that the delay of time ΔT is proportional to the equivalent resistance Rref of the switched capacitor resistor 400. By further substituting Equation 4 into Equation 6, the delay of time ΔT of the delay circuit 200 can be expressed as:

$$\Delta T = (C_L/(C_{SW} \cdot f_0))/K = (C_L/C_{SW})/(f_0 * K), \quad \text{[Equation 7]}$$

As shown by Equation 7 above, the delay of time of the delay circuit 200 is proportional to a ratio of the load capacitor $C_L$ of the delay circuit 200 to the switch capacitance $C_{SW}$ of the resistive module 320 (i.e., $(C_L/C_{SW})$). Since the ratio of the impedances of components in semiconductor integrated circuits is generally less susceptible to process variations and can be more precisely controlled than the impedance of an individual component, therefore, the bias generator 300 can provide more PVT-stable (or PVT-insensitive) bias signals. The availability of such PVT-stable bias signals is quite advantageous in semiconductor integrated circuit operation. In addition to providing more precise control of the delay circuit 200, one or more of the PVT-stable bias signals can be used in fine-tuning some implementations of the delay circuit 200, which will be further discussed below with reference to FIG. 6.

Furthermore, the pair of nMOS transistors 330 and 340 in the bias generator 300 are substantially the same as the pair of nMOS transistors 250 and 260 and the pair of nMOS transistors 230 and 240 in the delay circuit 200 or are sized to be at a predetermined ratio with each other. In other words, the pair of nMOS transistors 330 and 340 is a replica of the pair of nMOS transistors 250 and 260 and the pair of nMOS transistors 230 and 240. As such, the effect of any process variation on the nMOS transistors 330 and 340 can be substantially canceled out by similar effect of the process variation on the pair of nMOS transistors 230 and 240 or the pair of nMOS transistor 250 and 260.

Figure 5:
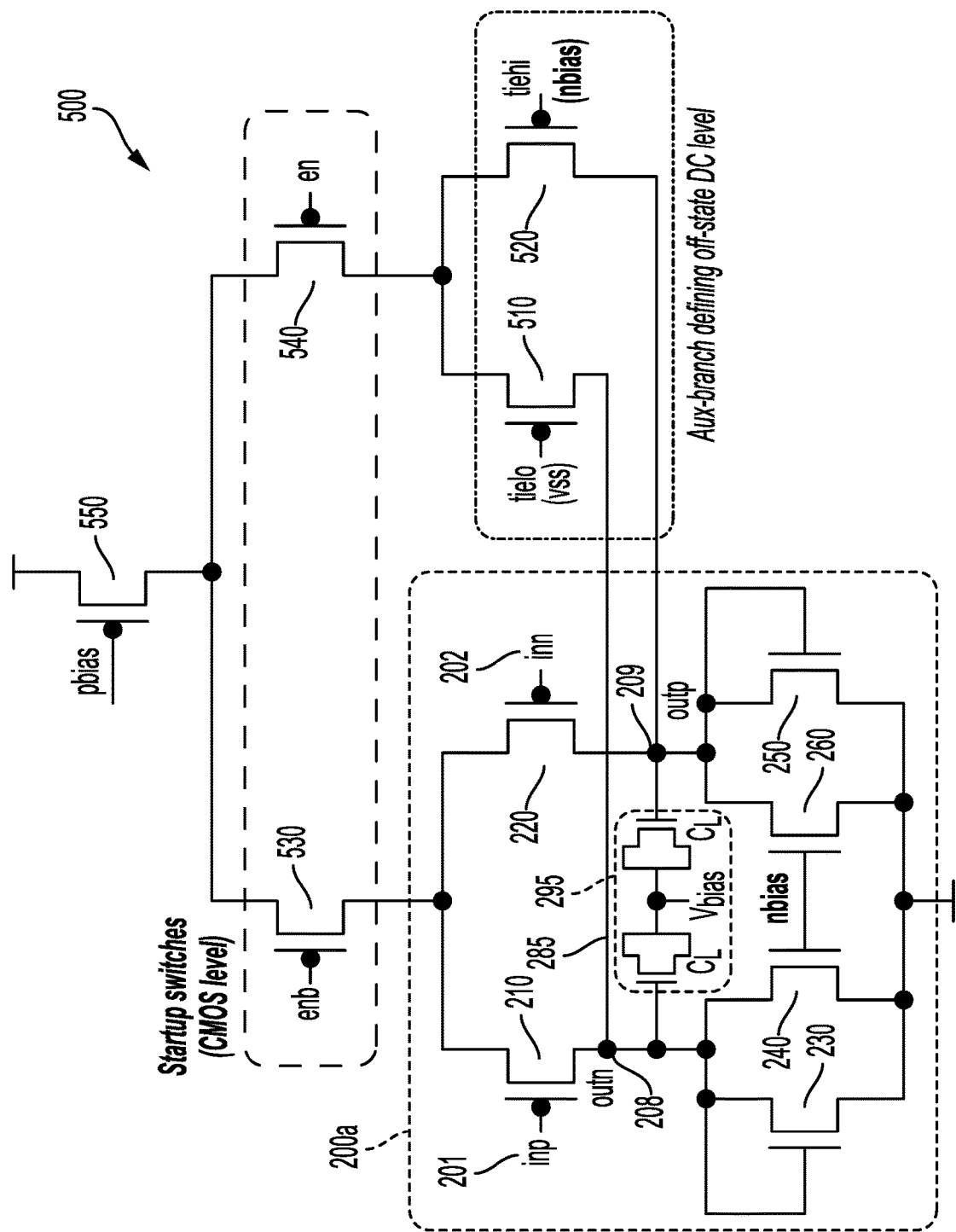
FIG. 5 shows another implementation of a CMOS delay circuit.

FIG. 5 shows another implementation of a CMOS delay circuit 500 that can be biased by the bias generator 300 in FIG. 3. The CMOS delay circuit 500 includes a core 200a that is substantially similar to the delay circuit 200 in FIG. 2. Thus, similar components are labeled with similar reference numerals within the core 200a. In addition to the core 200a, the CMOS delay circuit 500 includes an auxiliary branch having two pMOS transistors 510 and 520, a pair of startup switches 530 and 540, and a bias transistor 550.

In some implementations, the core 200a includes two input transistors 210 and 220, two pairs of transistors 230 and 240, and 250 and 260, and two load capacitors 285 and 295. The two pair of transistors 230 and 240, and 250 and 260 can also be referred to as active load transistors. The load capacitors 285 and 295 are each implemented using a metal oxide semiconductor (MOS) transistor. Further, the two load capacitors 285 and 295 can have substantially the same capacitance of $C_L$. A node between the load capacitors 280 and 290 is coupled to a bias voltage, $V_{bias}$. The bias voltage $V_{bias}$ can be provided by a bias generator, similar to the bias generator 300 shown in FIG. 3. The effective loading capacitance of the load capacitors 280 and 290 can be adjusted by changing the bias voltage $V_{bias}$, which in turn, changes the delay constant of the CMOS delay circuit 500.

In some implementations, the input transistors 210 and 220 of the core 200a are pMOS transistors. The sources of both input transistors 210 and 220 are coupled to the drain of the startup switch 530 above the core 200a in FIG. 5. The gate of the input transistor 210 is configured to receive an input signal inp and the gate of the input transistor 220 is configured to receive an input signal inn. The input signals inp and inn are a pair of differential input signals of complementary values. For example, when inp is at logic high, inn is at logic low; and vice versa. The drain of input transistor 210 is coupled to load capacitor 280 at an output node outn 208 on the left side of the core 200a. Likewise, the drain of input transistor 220 is coupled to load capacitor 290 at an output node outp 209 on the right side of the core 200a.

As shown in FIG. 5, the output node outn 208 is further coupled to the drains of the pair of active load transistors 230 and 240. The pair of active load transistors 230 and 240 are further coupled to each other at their sources, which is coupled to ground. The gate of the transistor 230 is connected to the drain of the transistor 230, whereas the gate of the transistor 240 is connected to the gate of the transistor 260 on the right side of the core 200a. The output node outp 209 is further coupled to the drains of the pair of transistors 250 and 260. The pair of transistors 250 and 260 are further coupled to each other at their sources, which is coupled to ground. The gate of the transistor 250 is connected to the drain of the transistor 250, whereas the gate of the transistor 260 is connected to the gate of the transistor 240 on the left side of the core 200a.

In some implementations, the active load transistors 230, 240, 250, and 260 are nMOS transistors. The gates of both transistors 240 and 260 are configured to be driven by a bias voltage nbias, which can be provided by a bias generator, such as the bias generator 300 shown in FIG. 3 described above.

As mentioned above, the sources of the input transistors 210 and 220 are coupled to the drain of the startup switch 530. The source of the startup switch 530 is coupled to the source of the other startup switch 540 and the drain of the bias transistor 550. The gate of the startup switch 540 is configured to receive an enable signal "en" and the gate of the other startup switch 530 is configured to receive a complementary signal "enb." In some implementations, both startup switches 530 and 540 are implemented using pMOS transistors. A source of the bias transistor 550 is coupled to a voltage supply $V_{DD}$. A gate of the bias transistor 550 is configured to receive a bias signal pbias from a bias generator, such as the bias generator 300 shown in FIG. 3 described above. When the bias signal pbias can turn on the bias transistor 550 and control how much bias current ($I_{bias}$) can flow from the voltage supply $V_{DD}$ through the bias transistor 550 to the startup switches 530 and 540. Details on the determination of the bias current $I_{bias}$ have been discussed above with reference to FIG. 3. When the delay circuit 500 is in an on-state, enb is low, turning on the startup switch 530 to allow the bias current $I_{bias}$ to flow through the startup switch 530 to the core 200a. Since the enable signal en is complementary to enb, en is high when enb is low, thus, turning off the other startup switch 540. As a result, no current flows through the other startup switch 540.

In some implementations, a drain of the other startup switch 540 is coupled to the sources of a pair of pMOS transistors 510 and 520. The pair of pMOS transistors 510 and 520 form an auxiliary branch in the delay circuit 500. The drains of the pMOS transistors 510 and 520 are coupled to the output nodes outn 208 and outp 209, respectively. When the delay circuit 500 is in an off-state, the enable signal "en" is low and the complementary signal "enb" is high. When enb becomes high, the startup switch 530 is turned off, preventing the bias current $I_{bias}$ from flowing through the startup switch 530. On the other side, where en is low, the other startup switch 540 is turned on, allowing the bias current $I_{bias}$ to flow through the other startup switch 540 to the pMOS transistors 510 and 520 in the auxiliary branch. In some implementations, the gate of the pMOS transistor 510 is coupled to ground or Vss (i.e., "tied low"), while the gate of the pMOS transistor 520 is coupled to the bias voltage nbias (i.e., "tied high") from a bias generator, such as the bias generator 300 in FIG. 3. Therefore, the pair of pMOS transistors 510 and 520 can define the off-state direct current (DC) level of the delay circuit 500 based on the bias voltage nbias. When the delay circuit 500 transitions into an on-state (or activated), en becomes high while enb become low. As a result, the startup switch 540 is turned off, preventing the bias current $I_{bias}$ from flowing into the auxiliary branch. On the contrary, the startup switch 530 is turned on to allow the bias current $I_{bias}$ to flow into the core 200a. This startup mechanism is very fast, and may be referred to as "near instant," because the pMOS transistors can be turned on very fast. The delay circuit 500 is thus particularly advantageous in implementing ring oscillators with near instant turning on or off capability. Details of one implementation of a ring oscillator is described below.

Figure 6:
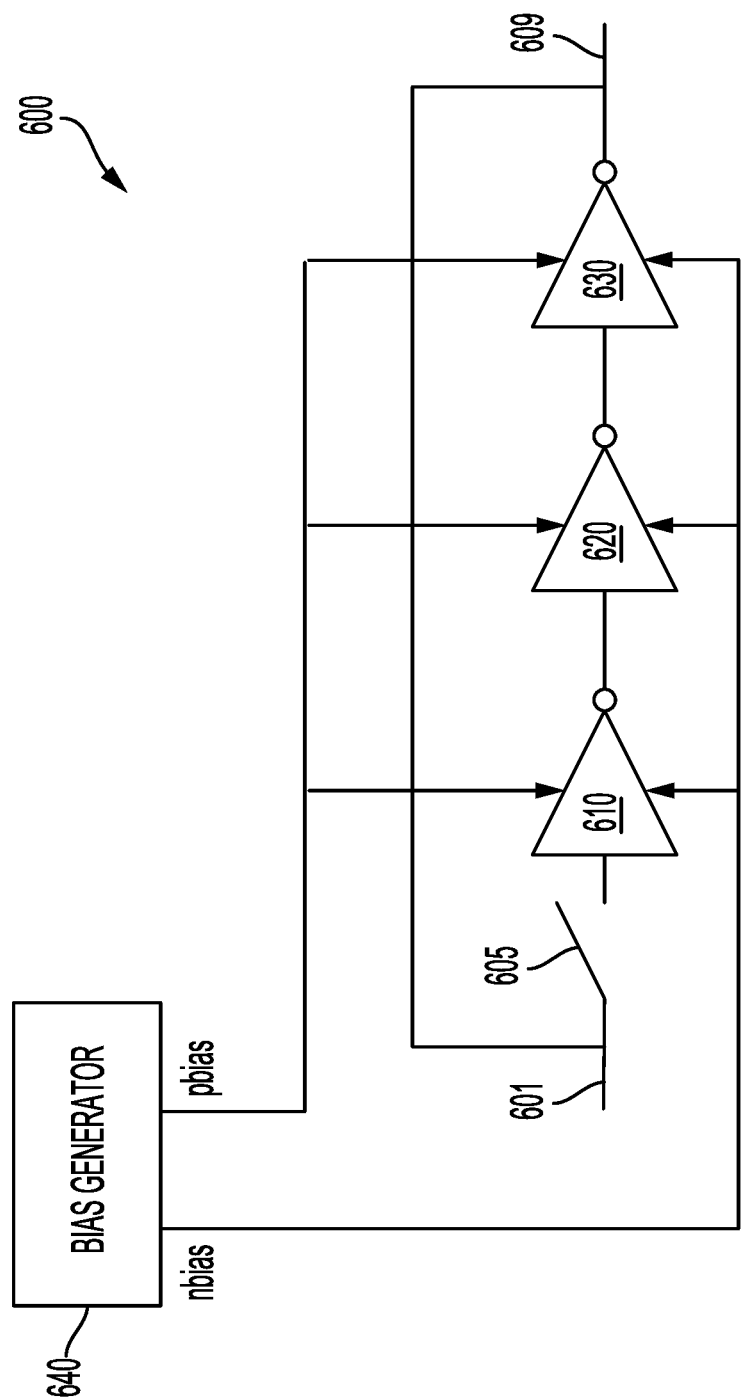
FIG. 6 shows one implementation of a ring oscillator.

FIG. 6 shows one implementation of a ring oscillator 600 built with delay circuits (such as the delay circuit 200 and/or delay circuit 500) and the bias generator 300. The ring oscillator 600 includes a bias generator 640 and three delay circuits 610, 620, and 630. In other implementations, the ring oscillator 600 may include more delay circuits (e.g., 4, 5, 6, etc.). The bias generator 640 is coupled to each of the delay circuits 610-630 to provide two bias signals, pbias and nbias, to each of the delay circuits 610-630. It should be appreciated that the ring oscillator 600 can have more than one bias generator to provide bias signals to the delay circuits 610-630. For example, there can be a bias generator provided for each of the delay circuits 610-630; or a bias generator provided for a subset of the delay circuits 610-630. Some implementations of the bias generator 640 have been described above with reference to FIG. 3.

In some implementations, the ring oscillator 600 has three delay circuits 610-630. The delay circuits 610-730 are coupled to each other to form a ring. Specifically, the output of delay circuit 610 is coupled to the input of delay circuit 620. Likewise, the output of delay circuit 620 is coupled to the input of delay circuit 630; and the output of delay circuit 630 is coupled to the input of delay circuit 610 via a switch 605 to complete the ring. The delay circuits 610-630 can be implemented using the delay circuit 500 shown in FIG. 5. In some implementations, the switch 605 can be implemented using an nMOS transistor (not shown), which turns on in response to the enable signal en going high, and vice versa.

When the ring oscillator is de-activated (or turned off), the enable signal en is low and its complementary signal enb is high. As discussed above, the switch 605 is turned off in response to the enable signal en being low. Also, as discussed above with reference to FIG. 5, each of the delay circuits 610-630 are also de-activated (or turned off) when en being low because the startup switch 530 is turned off. Furthermore, a bias current flows into the auxiliary branch of each of the delay circuits 610-630 because the startup switch 540 is turned on by enb. As discussed above with reference to FIG. 3, the gate of the pMOS transistor 510 is coupled to ground or Vss (i.e., "tied low"), while the gate of the pMOS transistor 520 is coupled to the bias voltage nbias (i.e., "tied high") from the bias generator 640. Therefore, the pair of pMOS transistors 510 and 520 can define the off-state DC level of the respective one of the delay circuits 610-630 based on the bias voltage nbias. In other words, the outputs (i.e., outp and outn in FIG. 5) of each of the delay circuits 610-630 can be defined by a good logic level to prepare for the start (or activation) of the ring oscillator 600.

When the enable signal en goes high and the complementary signal enb goes low to turn on (or to activate) the ring oscillator 600, the startup switch 530 is turned on and the startup switch 540 is turned off. As a result, the bias current flows into the core 200a of each of the delay circuits 610-630 to activate the delay circuits 610-630, while current flow into their respective auxiliary branches is cut off. The transition of the ring oscillator 600 from the off-state to the on-state as described above is very fast because of the nMOS and pMOS transistors can switch on/off very fast, and the outputs of the delay stages 610-630 have already been placed at a well-defined logic level ready for activation.

Figures 7A, 7B, 7C:
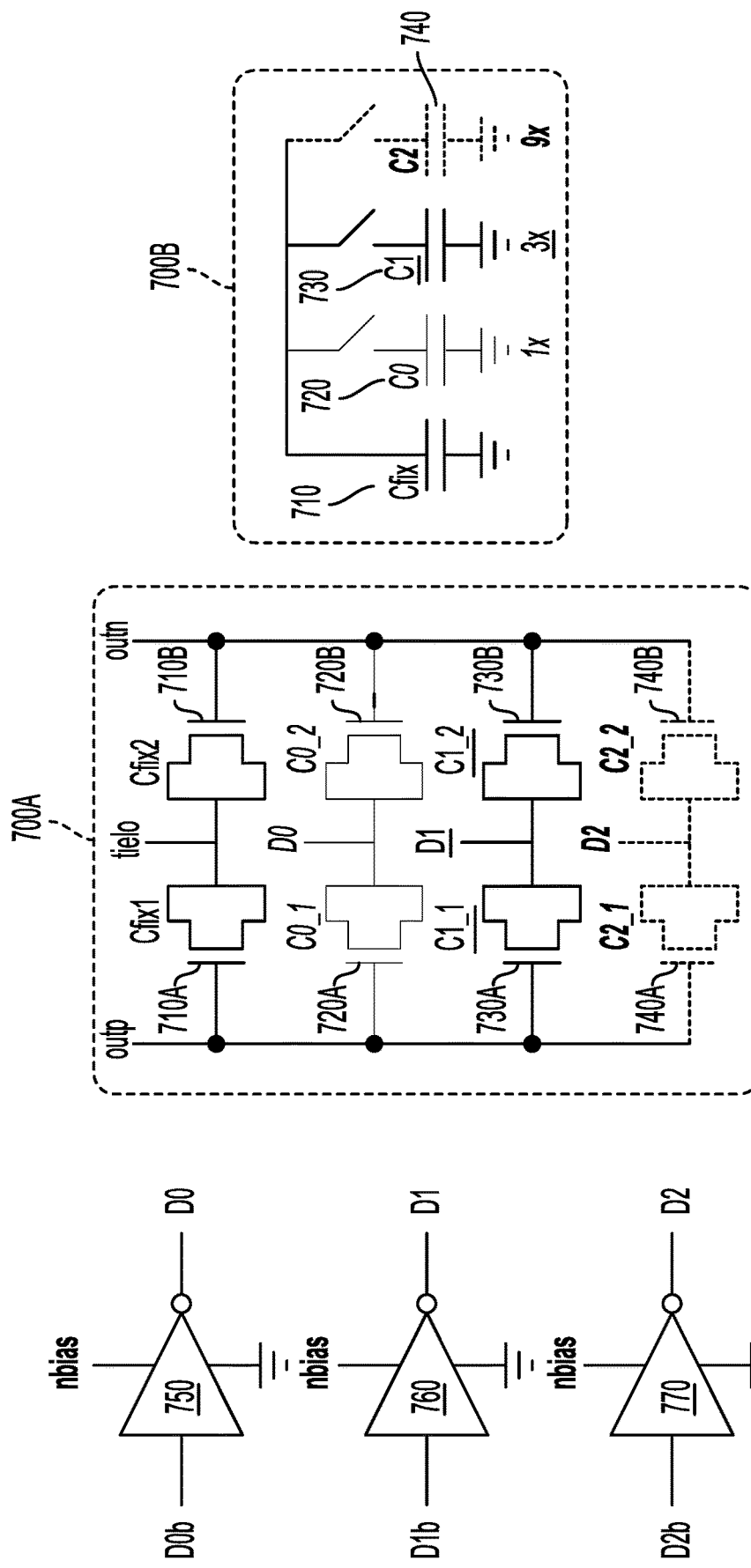
FIGS. 7A and 7B show implementations of a capacitor array usable for fine tuning a delay circuit.
FIG. 7C shows one implementation of a control module to generate control bits for the capacitor arrays in FIGS. 7A and 7B.

Another advantageous application of the PVT-stable bias signals provided by the bias generator 300 is in fine-tuning in some implementations of delay circuits. One example of such application is illustrated in FIGS. 7A-7C. FIG. 7A shows one implementation of the load capacitors of a CMOS delay circuit, such as the load capacitors 285 and 295 in the delay circuit 500 in FIG. 5, using a capacitor array 700A. The capacitor array 700A includes four pairs of capacitors 710A and 710B, 720A and 720B, 730A and 730B, and 740A and 740B. Each of the capacitors 710A, 710B, 720A, 720B, 730A, 730B, 740A, and 740B can be implemented using a MOS capacitor. The gates of 710A, 720A, 730A, and 740A are all coupled to an output node outp. Likewise, the gates of 710B, 720B, 730B, and 740B are all coupled to an output node outn. A node in between capacitors 710A and 710B is connected to a low voltage (i.e., tied low), such as Vss or ground. As such, the capacitor pair 710A and 710B is coupled to the output nodes outp and outn to provide a fixed minimum load capacitance to the delay circuit. A node in between capacitors 720A and 720B is connected together and configured to receive a control bit D0. Likewise, a node in between capacitors 730A and 730B is connected together and configured to receive a control bit D1; and a node in between capacitors 740A and 740B is connected together and configured to receive a control bit D2. Based on the value of the control bits D2-D0, the capacitor pairs 740A and 740B, 730A and 730B, and 720A and 720B can be selectively coupled to the output nodes outp and outn, respectively. By selectively connecting the capacitor pairs 740A and 740B, 730A and 730B, and 720A and 720B to the output nodes outp and outn, the effective capacitance of the capacitor array 700A can be adjusted.

FIG. 7B shows a circuit diagram modeling the capacitor array 700A in FIG. 7A. In the circuit model 600B, the four pairs of capacitors 710A and 710B, 720A and 720B, 730A and 730B, and 740A and 740B are represented or modeled by capacitors 710, 720, 730, and 740, respectively. In addition, each of the capacitors 720, 730, and 740 is coupled between a respective switch in the circuit model of the capacitor array 700B and ground. In response to the control bits D2-D0, the switches can selectively couple the capacitors 720, 730, and 740, individually or in combinations, to the capacitor 710, thus configuring the capacitor array 700B to provide different effective load capacitances to the delay circuit.

In some implementations, each of the control bits D2-D0 are provided by an invertor as shown in FIG. 7C. There are three inverters 750, 760, and 770 shown in FIG. 7C. Inverter 750 receives a signal D0b and outputs D0, inverter 760 receives a signal D1b and outputs D1, and inverter 770 receives a signal D2b and outputs D2. Instead of using one or more of the voltage supplies to the chip, all of the inverters 750, 760, and 770 are can use the bias voltage nbias as their voltage supply. As discussed above, the bias voltage nbias can be provided by the bias generator 300 shown in FIG. 3. There are several advantages in using the bias voltage nbias as the voltage supply to the inverters 750, 760, and 770. First, the bias voltage nbias is isolated from chip supply noise or voltage settings. Second, the differential swing at the output nodes outp and outn can make the bias nodes at near alternate current (AC) ground. Furthermore, no additional voltage buffer is needed in the design shown in FIG. 7C.

Figure 8:
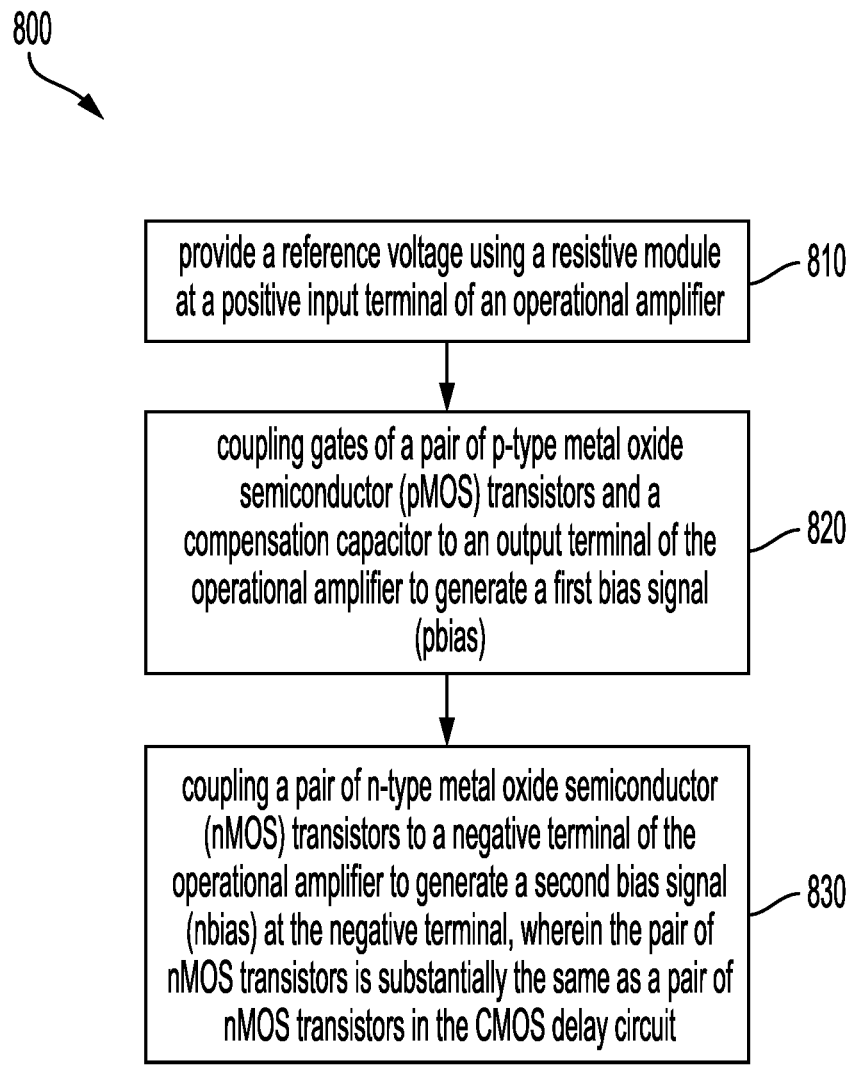
FIG. 8 shows one implementation of a method for generating precise and PVT-stable time delay or frequency using CMOS circuits.

FIG. 8 shows one implementation of a method 800 for generating precise and PVT-stable time delay or frequency using complementary metal oxide semiconductor (CMOS) circuits. The method can be performed by various implementations of the delay circuit 200 and/or delay circuit 500, and the bias generator 300 discussed above.

The method 800 begins at block 810, where a reference voltage is provided using a resistive module at a positive input of an operational amplifier in a bias generator. For example, the operational amplifier and the resistive module can be operational amplifier 310 and resistive module 320, respectively, in the bias generator 300 shown in FIG. 3. Then the method 800 transitions to block 820. In block 820, the gates of a pair of pMOS transistors and a compensation capacitor are coupled to the output of the operational amplifier to generate a first bias signal. For example, the first bias signal can be pbias shown in FIG. 3. Furthermore, the pair of pMOS transistors and the compensation capacitor can be the pair of pMOS transistors 370 and 380, and the compensation capacitor 350, respectively, shown in FIG. 3. From block 820, the method can transition to block 830, where a pair of nMOS transistors are coupled to a negative terminal of the operational amplifier to generate a second bias signal. For example, the second bias signal can be nbias shown in FIG. 3. Furthermore, the pair of nMOS transistors can be the pair of nMOS transistors 330 and 340 in FIG. 3. In some implementations, the pair of nMOS transistors can be substantially the same as another pair of nMOS transistors in the delay circuit, such as the pair of nMOS transistors 230 and 240, or the pair of nMOS transistors 250 and 260, of the delay circuit 200 shown in FIG. 2.

In some implementations, the resistive module has a switched capacitor resistor. The switched capacitor resistor can be implemented using a switch, a first capacitor having a capacitance of $C_{SW}$, and a second capacitor having a capacitance of $C_H$ coupled to each other in parallel. Then a delay of the CMOS delay circuit biased using the bias generator can be proportional to a ratio of a load capacitance $C_L$ of the CMOS delay circuit to $C_{SW}$. Note that, in general, the ratio of $C_L$ to $C_{SW}$ can be more accurately controlled relative to the capacitance (or impedance) of an individual component in semiconductor circuits. Thus, the method 800 can provide a more PVT-stable time delay than conventional approaches.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
at least one complementary metal oxide semiconductor (CMOS) delay circuit, wherein the at least one CMOS delay circuit comprises a first branch having a first input transistor and a first pair of n-type metal oxide semiconductor (nMOS) transistors, the first pair of nMOS transistors coupled to each other in parallel between a drain of the first input transistor and the ground; and
a bias generator configured to provide a first bias signal and a second bias signal to the at least one CMOS delay circuit, the bias generator including
an operational amplifier having an output, a positive input terminal, and a negative input terminal,
a resistive module coupled between the positive input terminal and ground, and
a pair of nMOS transistors coupled between the negative input terminal and the ground, wherein the output of the operational amplifier is configured to provide the first bias signal, and the negative input terminal of the operational amplifier is configured to provide the second bias signal, wherein the pair of nMOS transistors of the bias generator and the first pair of nMOS transistors are substantially the same.

2. The apparatus of claim 1, wherein the at least one CMOS delay circuit comprises a second branch having a second input transistor and a second pair of nMOS transistors, the second pair of nMOS transistors coupled to each other in parallel between a drain of the second input transistor and the ground.

3. The apparatus of claim 2, wherein the pair of nMOS transistors of the bias generator, the first pair of nMOS transistors, and the second pair of nMOS transistors are substantially the same.

4. The apparatus of claim 3, wherein the at least one CMOS delay circuit further comprises a bias transistor having a gate, a source, and a drain, the gate is configured to receive the first bias signal from the bias generator and the source is configured to receive a voltage supply.

5. The apparatus of claim 4, wherein the bias transistor is a p-type metal oxide semiconductor (pMOS) transistor.

6. The apparatus of claim 4, wherein the at least one CMOS delay circuit further comprises:
a first startup switch having a source, a drain, and a gate, the source of the first startup switch coupled to the drain of the bias transistor and the drain of the first startup switch coupled to a source of the first input transistor;
a second startup switch having a source, a drain, and a gate, the source of the second startup switch coupled to the drain of the bias transistor; and
an auxiliary branch having a first pMOS transistor and a second pMOS transistor, wherein the first pMOS transistor is coupled between the drain of the second startup switch and the drain of the first input transistor, the second pMOS transistor is coupled between the drain of the second startup switch and the drain of the second input transistor.

7. The apparatus of claim 6, wherein a gate of the first pMOS transistor of the auxiliary branch is configured to receive a low voltage supply and a gate of the second pMOS transistor of the auxiliary branch is configured to receive the second bias signal from the bias generator.

8. The apparatus of claim 3, wherein a gate of a first nMOS transistor of the first pair of nMOS transistors and a gate of a second nMOS transistor of the second pair of nMOS transistors are coupled together and configured to receive the second bias signal from the bias generator.

9. The apparatus of claim 1, wherein a delay of the at least one CMOS delay circuit is proportional to an equivalent resistance Rref of the resistive module.

10. The apparatus of claim 1, wherein the resistive module comprises a switched capacitor resistor having a switch, a first capacitor having a capacitance of $C_{SW}$, and a second capacitor having a capacitance of $C_H$ coupled to each other in parallel.

11. The apparatus of claim 10, wherein the at least one CMOS delay circuit further includes:
    a first load capacitor coupled between a first output node and the ground; and
    a second load capacitor coupled between a second output node and the ground, wherein the first load capacitor and the second load capacitor have substantially the same capacitance $C_L$ and the delay is proportional to a ratio of $C_L$ to $C_{SW}$.

12. The apparatus of claim 1, wherein the at least one CMOS delay circuit further comprises a capacitor array for fine tuning of the delay, the capacitor array is configured to receive a plurality of control bits from a plurality of buffers biased by the second bias signal from the bias generator.

13. The apparatus of claim 1, wherein the resistive module comprises a variable resistor.

14. A ring oscillator, comprising:
    a plurality of complementary metal oxide semiconductor (CMOS) delay circuits coupled to each other in series to form a ring, wherein each of the plurality of CMOS delay circuits comprises a first branch having a first input transistor and a first pair of n-type metal oxide semiconductor (nMOS) transistors, the first pair of nMOS transistors coupled to each other in parallel between a drain of the first input transistor and the ground; and
    a bias generator configured to provide a first bias signal (pbias) and a second bias signal (nbias) to at least one of the plurality of CMOS delay circuits, the at least one bias generator including
        an operational amplifier having an output, a positive input terminal, and a negative input terminal,
        a resistive module coupled between the positive input terminal and ground, and
        a pair of nMOS transistors coupled between the negative input terminal and the ground, wherein the output of the operational amplifier is configured to provide the first bias signal and the negative input terminal of the operational amplifier is configured to provide the second bias signal, wherein the pair of nMOS transistors of the bias generator and the first pair of nMOS transistors are substantially the same.

15. The ring oscillator of claim 14, wherein each of the plurality of CMOS delay circuits comprises a second branch having a second input transistor and a second pair of nMOS transistors, the second pair of nMOS transistors coupled to each other in parallel between a drain of the second input transistor and the ground.

16. The ring oscillator of claim 15, wherein the pair of nMOS transistors of the bias generator, the first pair of nMOS transistors, and the second pair of nMOS transistors are substantially the same.

17. The ring oscillator of claim 16, wherein each of the plurality of CMOS delay circuits further comprises a bias transistor having a gate, a source, and a drain, the gate is configured to receive the first bias signal from the bias generator and the source is configured to receive a voltage supply.

18. The ring oscillator of claim 17, wherein the bias transistor is a p-type metal oxide semiconductor (pMOS) transistor.

19. The ring oscillator of claim 17, wherein each of the plurality of CMOS delay circuits further comprises:
    a first startup switch having a source, a drain, and a gate, the source of the first startup switch coupled to the drain of the bias transistor and the drain of the first startup switch coupled to a source of the first input transistor;
    a second startup switch having a source, a drain, and a gate, the source of the second startup switch coupled to the drain of the bias transistor; and
    an auxiliary branch having a first pMOS transistor and a second pMOS transistor, wherein the first pMOS transistor is coupled between the drain of the second startup switch and the drain of the first input transistor, the second pMOS transistor is coupled between the drain of the second startup switch and the drain of the second input transistor.

20. The ring oscillator of claim 19, wherein a gate of the first pMOS transistor of the auxiliary branch is configured to receive a low voltage supply and a gate of the second pMOS transistor of the auxiliary branch is configured to receive the second bias signal from the bias generator.

21. The ring oscillator of claim 16, wherein a gate of a first nMOS transistor of the first pair of nMOS transistors and a gate of a second nMOS transistor of the second pair of nMOS transistors are coupled together and configured to receive the second bias signal from the bias generator.

22. The ring oscillator of claim 14, wherein a delay of each of the plurality of CMOS delay circuits is proportional to an equivalent resistance Rref of the resistive module.

23. The ring oscillator of claim 14, wherein the resistive module comprises a switched capacitor resistor having a switch, a first capacitor having a capacitance of $C_{SW}$, and a second capacitor having a capacitance of $C_H$, coupled to each other in parallel.

24. The ring oscillator of claim 23, wherein each of the plurality of CMOS delay circuits further includes:
    a first load capacitor coupled between a first output node and the ground; and
    a second load capacitor coupled between a second output node and the ground, wherein the first load capacitor and the second load capacitor have substantially the same capacitance $C_L$ and the delay is proportional to a ratio of $C_L$ to $C_{SW}$.

25. The ring oscillator of claim 14, wherein each of the plurality of CMOS delay circuits further comprises a capacitor array for fine tuning of the delay, the capacitor array is configured to receive a plurality of control bits from a plurality of buffers biased by the second bias signal.

26. The ring oscillator of claim 14, wherein the resistive module comprises a variable resistor.

* * * * *